United States Patent
Hsu et al.

(10) Patent No.: US 10,304,516 B1
(45) Date of Patent: May 28, 2019

(54) DRAM FOR STORING DATA AND METHOD OF OPERATING THE SAME

(71) Applicant: NANYA TECHNOLOGY CORPORATION, New Taipei (TW)

(72) Inventors: Ting-Shuo Hsu, New Taipei (TW); Chih-jen Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/918,355

(22) Filed: Mar. 12, 2018

Related U.S. Application Data

(60) Provisional application No. 62/609,840, filed on Dec. 22, 2017.

(51) Int. Cl.
*G11C 11/406* (2006.01)
*G11C 7/02* (2006.01)

(52) U.S. Cl.
CPC .......... *G11C 11/40626* (2013.01); *G11C 7/02* (2013.01); *G11C 11/40618* (2013.01)

(58) Field of Classification Search
CPC ... G11C 11/40626; G11C 7/02; G11C 7/1063; G11C 11/40611; G11C 11/40618
USPC .......................................................... 365/149
See application file for complete search history.

(56) References Cited

U.S. PATENT DOCUMENTS

| | | | |
|---|---|---|---|
| 9,087,602 B2 * | 7/2015 | Youn ................. | G11C 11/40615 |
| 9,431,092 B2 * | 8/2016 | Lim ..................... | G11C 11/408 |
| 9,715,937 B1 * | 7/2017 | Pang ..................... | G11C 16/26 |
| 9,922,694 B2 * | 3/2018 | Akamatsu ............. | G11C 29/78 |
| 2014/0355332 A1 * | 12/2014 | Youn ................. | G11C 11/40615 365/149 |
| 2015/0340077 A1 * | 11/2015 | Akamatsu ............. | G11C 29/78 365/96 |
| 2016/0055896 A1 * | 2/2016 | Lim ..................... | G11C 11/408 365/149 |
| 2017/0365349 A1 * | 12/2017 | Pang ..................... | G11C 16/26 |

\* cited by examiner

*Primary Examiner* — Xiaochun L Chen
(74) *Attorney, Agent, or Firm* — Muncy, Geissler, Olds & Lowe, PC

(57) ABSTRACT

The present disclosure provides a dynamic random access memory (DRAM) and a method of operating the same. The DRAM includes a storage area and a control device. The storage area includes a memory row. The control device is configured to selectively allow the memory row to be eligible for a row-hammer refresh according to temperature of the DRAM.

12 Claims, 10 Drawing Sheets

DRAM FOR STORING DATA AND METHOD OF OPERATING THE SAME

PRIORITY CLAIM AND CROSS-REFERENCE

This application claims the benefit of provisional application Ser. 62/609,840 filed on Dec. 22, 2017 and entitled "DRAM," the disclosure of which is hereby incorporated by reference in its entirety.

TECHNICAL FIELD

The present disclosure relates to a dynamic random access memory (DRAM) and a method of operating the same, and more particularly, to a management of a refresh of the DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a dynamic random access memory (DRAM). The DRAM comprises a storage area and a control device. The storage area includes a memory row. The control device is configured to selectively allow the memory row to be eligible for a row-hammer refresh according to a temperature of the DRAM.

In some embodiments, the DRAM further comprises a sensor configured to sense the temperature of the DRAM.

In some embodiments, the control device is further configured to selectively allow the memory row to be eligible for the row-hammer refresh according to the temperature of the DRAM and access time of the memory row.

In some embodiments, the control device is further configured to determine a threshold number of times for determining whether the memory row is eligible for the row-hammer refresh according to a comparison result between the temperature and a threshold temperature.

In some embodiments, the control device is further configured to selectively allow the memory row to be eligible for the row-hammer refresh according to the threshold number of times.

In some embodiments, when the temperature is higher than the threshold temperature, the control device determines a first threshold times. When the temperature is lower than the threshold temperature, the control device determines a second threshold times greater than the first threshold times.

In some embodiments, the control device is further configured to, according to the temperature, adjust a threshold number of times for determining whether the memory row is eligible for the row-hammer refresh.

In some embodiments, the control device is further configured to selectively allow the memory row to be eligible for the row-hammer refresh according to the threshold number of times.

Another aspect of the present disclosure provides a dynamic random access memory (DRAM). The DRAM comprises a sensor and a storage area. The sensor is configured to sense a temperature of the DRAM. The storage area includes a memory row. A threshold number of times, for determining whether the memory row is eligible for a row-hammer refresh, is positively correlated to the temperature.

In some embodiments, the DRAM further comprises a control device. The control device is configured to selectively allow the memory row to be eligible for the row-hammer refresh according to the threshold number of times.

In some embodiments, the control device is further configured to selectively allow the memory row to be eligible for the row-hammer refresh according to the temperature of the DRAM and access time of the memory row.

In some embodiments, the control device is further configured to determine the threshold number of times according to a comparison result between the temperature and a threshold temperature.

In some embodiments, when the temperature is higher than the threshold temperature, the control device determines a first threshold times. When the temperature is lower than the threshold temperature, the control device determines a second threshold times greater than the first threshold times.

In some embodiments, the control device is further configured to, according to the temperature, adjust the threshold number of times.

Another aspect of the present disclosure provides a method of operating a dynamic random access memory (DRAM). The method comprises: sensing temperature of the DRAM; and selectively allowing a memory row to be eligible for a row-hammer refresh according to the temperature.

In some embodiments, the method further comprises: selectively allowing the memory row to be eligible for the row-hammer refresh according to the temperature and access time of the memory row.

In some embodiments, the method further comprises: determining a threshold number of times for determining whether the memory row is eligible for the row-hammer refresh according to a comparison result between the temperature and a threshold temperature.

In some embodiments, the method further comprises: selectively allowing the memory row to be eligible for the row-hammer refresh according to the threshold number of times.

In some embodiments, the method further comprises: adjusting a threshold number of times for determining whether the memory row is eligible for the row-hammer refresh according to the temperature.

In some embodiments, the method further comprises: selectively allowing the memory row to be eligible for the row-hammer refresh according to the threshold number of times.

In the present disclosure, the control device determines whether to allow a memory row to be eligible for the row-hammer refresh based not only on access time of the memory row but also on the temperature.

At relatively low temperatures, a threshold to perform a row-hammer refresh is relatively high. Consequently, in a given operating environment, the number of times of a row-hammer refresh is relatively low. As a result, power consumption of the DRAM is relatively efficient.

Moreover, at relatively high temperatures, a threshold to perform a row-hammer refresh is relatively low. Consequently, in a given operating environment, the number of times of a row-hammer refresh is relatively high. As a result, data stored in the memory row is less likely to be lost at the relatively high temperatures.

In some existing DRAMs, a threshold to perform a row-hammer refresh is constant regardless of the temperature. As a result, at the relatively low temperatures and in a given operating environment, the number of times of a row-hammer refresh is relatively high. As a result, power consumption of such DRAM is relatively inefficient. Moreover, at the relatively high temperatures and in a given operating environment, the number of times of a row-hammer refresh is relatively low. As a result, such DRAM has a greater likelihood of losing data.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
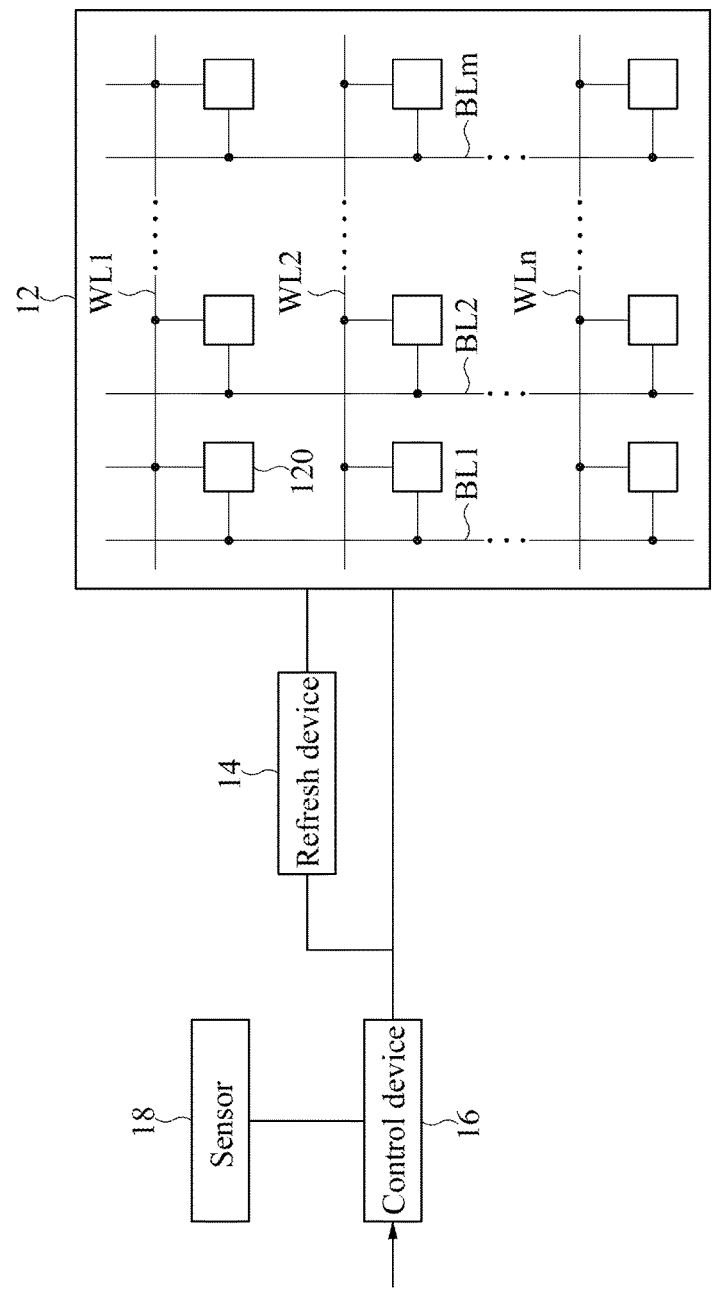
FIG. 1 is a schematic diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a dynamic random access memory (DRAM) 10, in accordance with some embodiments of the present disclosure. Referring to FIG. 1, the DRAM 10 includes a storage area including a memory array 12, a refresh device 14, a control device 16 and a sensor 18.

The memory array 12 functions to store data. The memory array 12 includes a plurality of memory cells 120 arranged in a two-dimensional array. The memory cell 120 functions to store data. In addition to the memory cells 120, the memory array 12 further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 120. The memory cells 120 in a single row and a word line for accessing those memory cells 120 can together be deemed as a memory row. For brevity of discussion, in the following figures, word lines, bit lines, and memory cells are not depicted, and only a memory row is illustrated. Moreover, in the present embodiment, a single memory array 12 is described and illustrated. However, the present disclosure is not limited thereto. In some embodiments, the DRAM 10 may include a plurality of memory arrays, and those memory arrays operate and are operated in the same manner as the memory array 12 as discussed below.

The refresh device 14 functions to perform a row-hammer refresh on the memory array 12 so as to alleviate or even eliminate a row-hammer effect. In further detail, a memory row is subject to a row-hammer effect when the memory row is accessed a large number of times within a self-refresh cycle. For example, when a memory row is accessed more than, for example, about 300,000 times within a self-refresh cycle, the memory row is subject to a row-hammer effect, i.e. a row-hammer effect may occur. To facilitate a better understanding of the row-hammer effect, assume that the memory cells 120 of two memory rows (hereinafter, the victim rows) immediately adjacent to the memory row (hereinafter, the target row) have a logic HIGH. If the target row is accessed more than, for example, about 300,000 times in a given period, data stored by the victim rows may be flipped from a logic HIGH to a logic LOW without accessing the victim memory rows. Such effect is called a row-hammer effect. Since such flip is not intended, such flip may lead to the DRAM 10 functioning abnormally, or providing the wrong data.

The sensor 18 functions to sense a temperature of the DRAM 10. In some possible implementations, the sensor 18 is able to be arranged in the memory array 12, nearby a memory row of interest to a circuit designer. Accordingly, the control device 16 is able to perform an operation based on the temperature of such memory row.

The control device 16 functions to selectively allow a memory row to be eligible for a row-hammer refresh according to the temperature sensed by the sensor 18 and access time of the memory row.

Generally, a possibility of occurrence of a row-hammer effect increases as temperature increases. Conversely, if the temperature is relatively low, the possibility is relatively low even if a memory row is accessed a large number of times within a self-refresh cycle.

In the present disclosure, the control device 16 determines whether to allow a memory row to be eligible for a row-hammer refresh based not only on access time of the memory row but also on the temperature sensed by the sensor 18.

The function of the control device 16 at relatively low temperatures and in a given operating environment allows a relatively high threshold to perform a row-hammer refresh. Because such threshold is not easily reached, a row-hammer refresh is performed a relatively low number of times. As a result, power consumption of the DRAM 10 is relatively efficient.

Moreover, the function of the control device 16 at relatively high temperatures and in a given operating environment allows a relatively low threshold to perform a row-hammer refresh. Because such threshold is not easily reached, a row-hammer refresh is performed a relatively high number of times. As a result, data store in the memory row is less likely to be lost at the relatively high temperatures at the relatively high temperatures.

In some existing DRAMs, a threshold to perform a row-hammer refresh is constant regardless of the temperature. As previously mentioned, at relatively low temperatures, the possibility of occurrence of a row-hammer effect is relatively low. It is not necessarily to perform a row-hammer refresh so frequently. However, since, in the existing DRAMs, the threshold is constant, at the relatively low temperatures and in a given operating environment, the number of times of a row-hammer refresh is still relatively high. As a result, power consumption of such DRAM is relatively inefficient. Moreover, at the relatively high temperatures and in a given operating environment, the number of times of a row-hammer refresh is relatively low. As a result, such DRAM has a greater likelihood of losing data.

Figure 2:
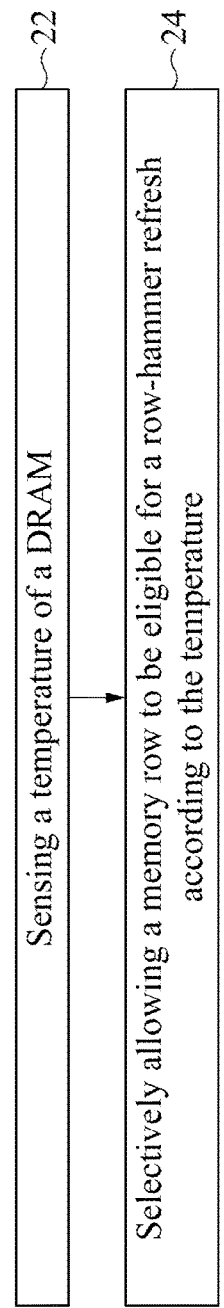
FIG. 2 is a flow chart of a method of operating a DRAM, in accordance with some embodiments of the present disclosure.

FIG. 2 is a flow chart of a method 20 of operating a DRAM, in accordance with some embodiments of the present disclosure. Referring to FIG. 2, the method 20 includes operations 22 and 24.

The method 20 begins with operation 22, in which a temperature of the DRAM is sensed.

The method 20 proceeds to operation 24, in which a memory row is selectively allowed to be eligible for a row-hammer refresh according to the temperature.

The method 20 is merely an example, and is not intended to limit the present disclosure beyond what is explicitly recited in the claims. Additional operations can be provided before, during, and after the method 20, and some operations described can be replaced, eliminated, or moved around for additional embodiments of the method.

In the present disclosure, power consumption of a DRAM adopting the method 20 to perform a row-hammer refresh is relatively efficient.

Figure 3:
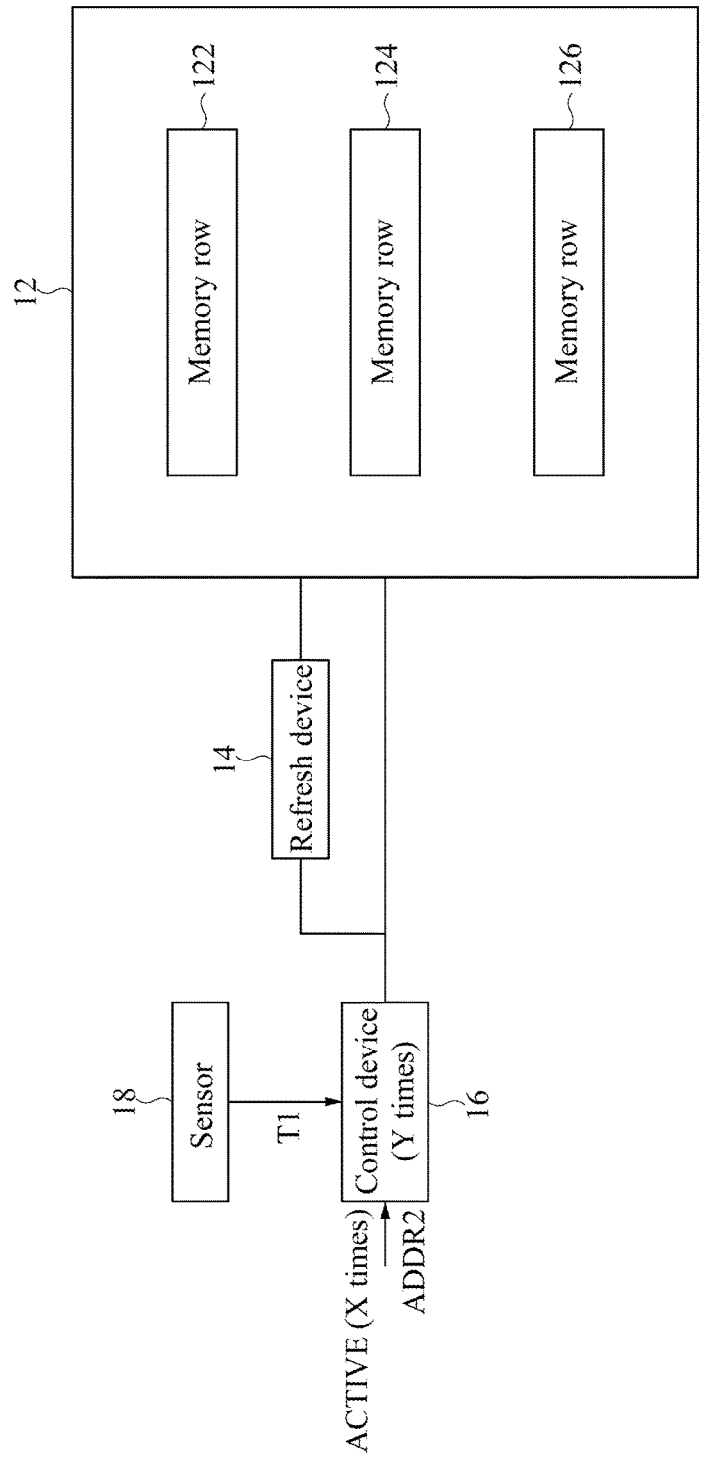
FIG. 3 is a schematic diagram illustrating an operation of the DRAM shown in FIG. 1, in accordance with some embodiments of the present disclosure.

FIG. 3 is a schematic diagram illustrating an operation of the DRAM 10 shown in FIG. 1, in accordance with some embodiments of the present disclosure. Referring to FIG. 3, the memory array 12 includes memory rows 122, 124 and 126.

In operation, the sensor 18 senses that the temperature of the DRAM 10 is a temperature T1, and transmits the sensing result to the control device 16. The control device 16 determines that a threshold number of times is Y times, for example, 5,000 times, according to the temperature T1. Moreover, the control device 16 receives a command ACTIVE, which indicates to access the memory row 124 associated with an address ADDR2, X times, for example 3,000 times, which is less than Y times. Therefore, the control device 16 does not allow the memory row 124 to be eligible for a row-hammer refresh (i.e., the control device 16 prohibits the memory 124 from having a row-hammer refresh performed thereon).

Figure 4:
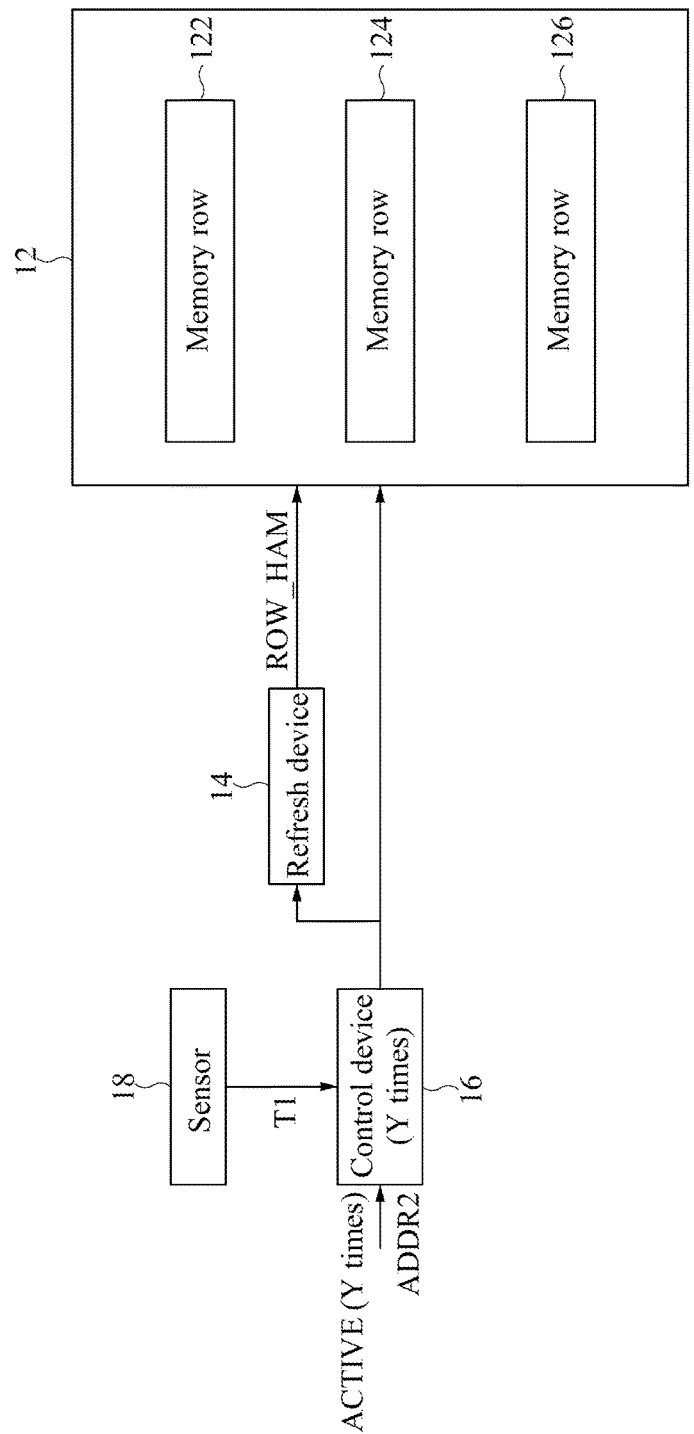
FIG. 4 is a schematic diagram illustrating another operation of the DRAM shown in FIG. 1 in accordance with some embodiments of the present disclosure.

FIG. 4 is a schematic diagram illustrating another operation of the DRAM 10 shown in FIG. 1, in accordance with some embodiments of the present disclosure. Referring to FIG. 4, in operation, the control device 16 receives the command ACTIVE, which indicates to access the memory row 124 associated with an address ADDR2, Y times, which is equal to the threshold number of times (i.e., Y times determined according to the temperature T1). Therefore, the control device 16 allows the memory row 124 to be eligible for a row-hammer refresh (i.e., the control device 16 allows the memory 124 to have a row-hammer refresh performed thereon).

Figure 5:
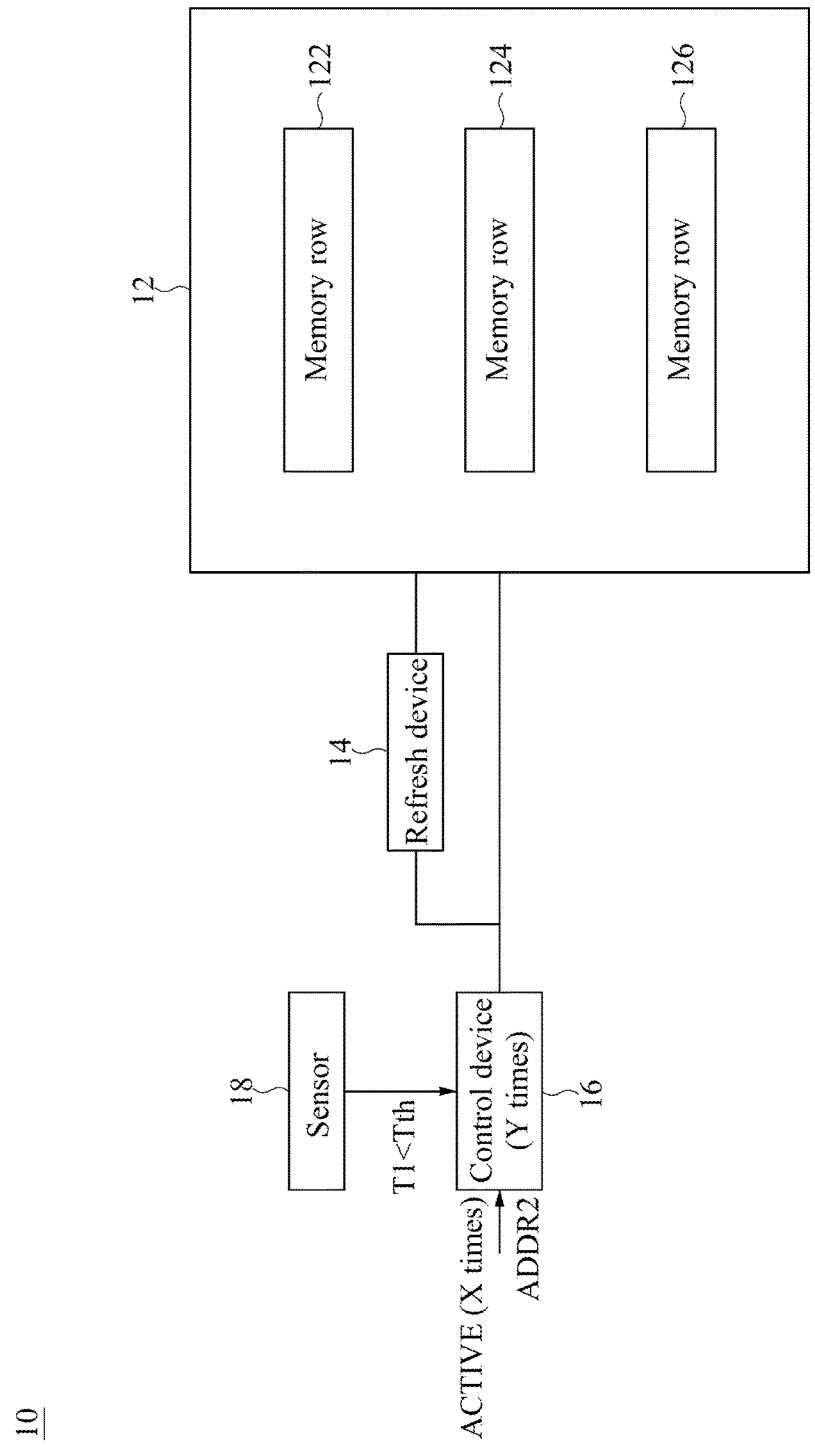
FIG. 5 is a schematic diagram illustrating an operation of the DRAM shown in FIG. 1 in a scenario of determining a threshold number of times, in accordance with some embodiments of the present disclosure.

FIG. 5 is a schematic diagram illustrating an operation of the DRAM 10 shown in FIG. 1 in a scenario of determining a threshold number of times, in accordance with some embodiments of the present disclosure. Referring to FIG. 5, the control device 16 determines a threshold number of times for determining whether the memory row 124 is eligible for the row-hammer refresh according to a comparison result between the temperature and a threshold temperature Tth.

In the scenario shown in FIG. 5, the sensor 18 senses the temperature T1, which is less than the threshold temperature Tth. Accordingly, the control device 16 determines that a threshold number of times is Y times according to a comparison result between the temperature T1 and the threshold temperature Tth.

Since the control device 16 receives the command ACTIVE X times, which is less than Y times, wherein Y times is a threshold number of times. Therefore, the control device 16 does not allow the memory row 124 to be eligible for a row-hammer refresh.

Figure 6:
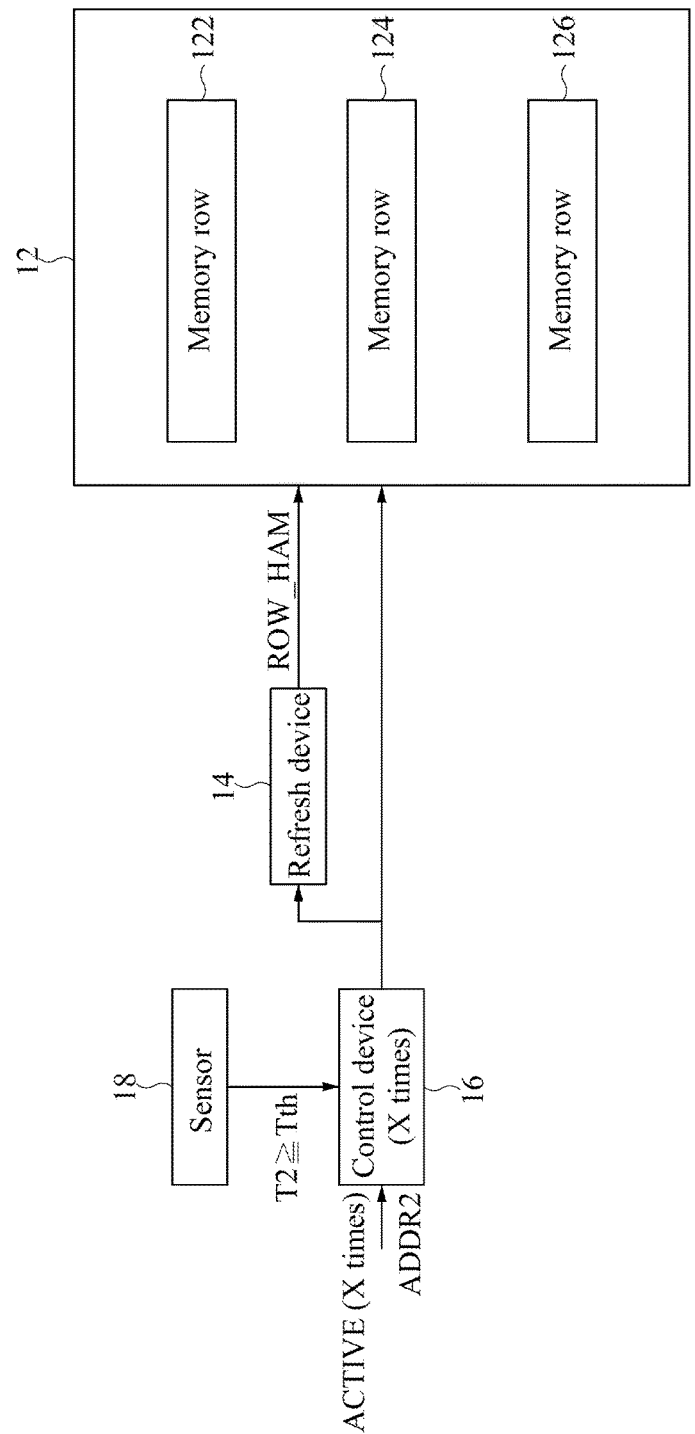
FIG. 6 is a schematic diagram illustrating another operation of the DRAM shown in FIG. 1 in the scenario of FIG. 5, in accordance with some embodiments of the present disclosure.

FIG. 6 is a schematic diagram illustrating another operation of the DRAM 10 shown in FIG. 1 in the scenario of FIG. 5, in accordance with some embodiments of the present disclosure. Referring to FIG. 6, the sensor 18 senses the temperature T2, which is equal to or greater than the threshold temperature Tth. Accordingly, the control device 16 determines that a threshold member of times is X times, which is less than the Y times, wherein X times is determined according to a comparison result between the temperature T2 and the threshold temperature Tth.

Since the control device 16 receives the command ACTIVE X times. The access times of X times equals to threshold number of times of X times. Therefore, the control device 16 allows the memory row 124 to be eligible for a row-hammer refresh.

Compared to the embodiment shown in FIG. 5, at relatively high temperatures as shown in FIG. 6, the threshold number of times (X times) is relatively low and therefore is easily reached. A row-hammer refresh is performed on the memory row 124 relatively frequently in a given operating environment. As a result, data stored in the memory row 124 is less likely to be lost.

In contrast, comparing the embodiment shown in FIG. 5 to that shown in FIG. 4, in the embodiment of FIG. 4, the temperature T1 is relatively low and therefore the threshold number of times (Y times) is relatively high and therefore is not easily reached. A row-hammer refresh is performed on the memory row 124 relatively infrequently in a given operating environment. As a result, power consumption of the DRAM 10 is relatively efficient.

In some existing DRAMs, a threshold number of times for determining whether a memory row is eligible for the row-hammer refresh is constant and cannot be changed, and in particular cannot be changed according to a temperature of the DRAM. As such, the DRAM operating at the relatively high temperature still determines whether to perform a row-hammer refresh according to a same threshold number of times as that utilized by the DRAM operating at the relatively low temperature. As a result, there is a greater likelihood of losing data stored by the DRAM. Conversely, when a temperature is decreased to a relatively low temperature, the threshold number of times is not changed and therefore still kept relatively low. The relatively low threshold number of times is easily to be reached, and therefore a row-hammer refresh is performed relatively frequently in a given operating environment. As a result, power consumption of such DRAM is relatively inefficient.

Figure 7:
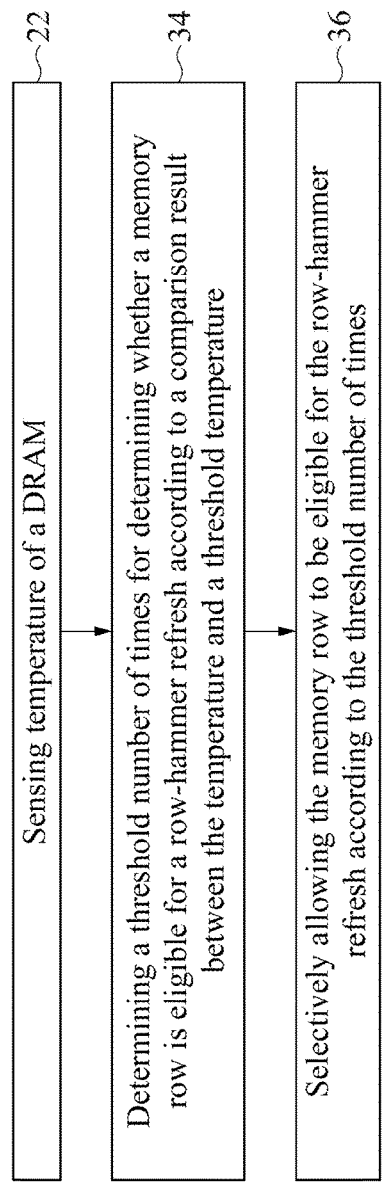
FIG. 7 is a flow chart of another method of operating a DRAM, in accordance with some embodiments of the present disclosure.

FIG. 7 is a flow chart of another method 70 of operating a DRAM, in accordance with some embodiments of the present disclosure. Referring to FIG. 7, the method 70 is similar to the method 20 described and illustrated with reference to FIG. 2 except that, for example, the method 70 includes operations 34 and 36.

The method 30 begins with operation 34, in which a threshold number of times for determining whether a memory row is eligible for a row-hammer refresh is determined according to a comparison result between the temperature and a threshold temperature.

The method 30 proceeds to operation 36, in which a memory row is selectively allowed to be eligible for a row-hammer refresh according to the threshold number of times.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

In the present disclosure, power consumption of a DRAM adopting the method 30 to perform a row-hammer refresh is relatively efficient.

Figure 8:
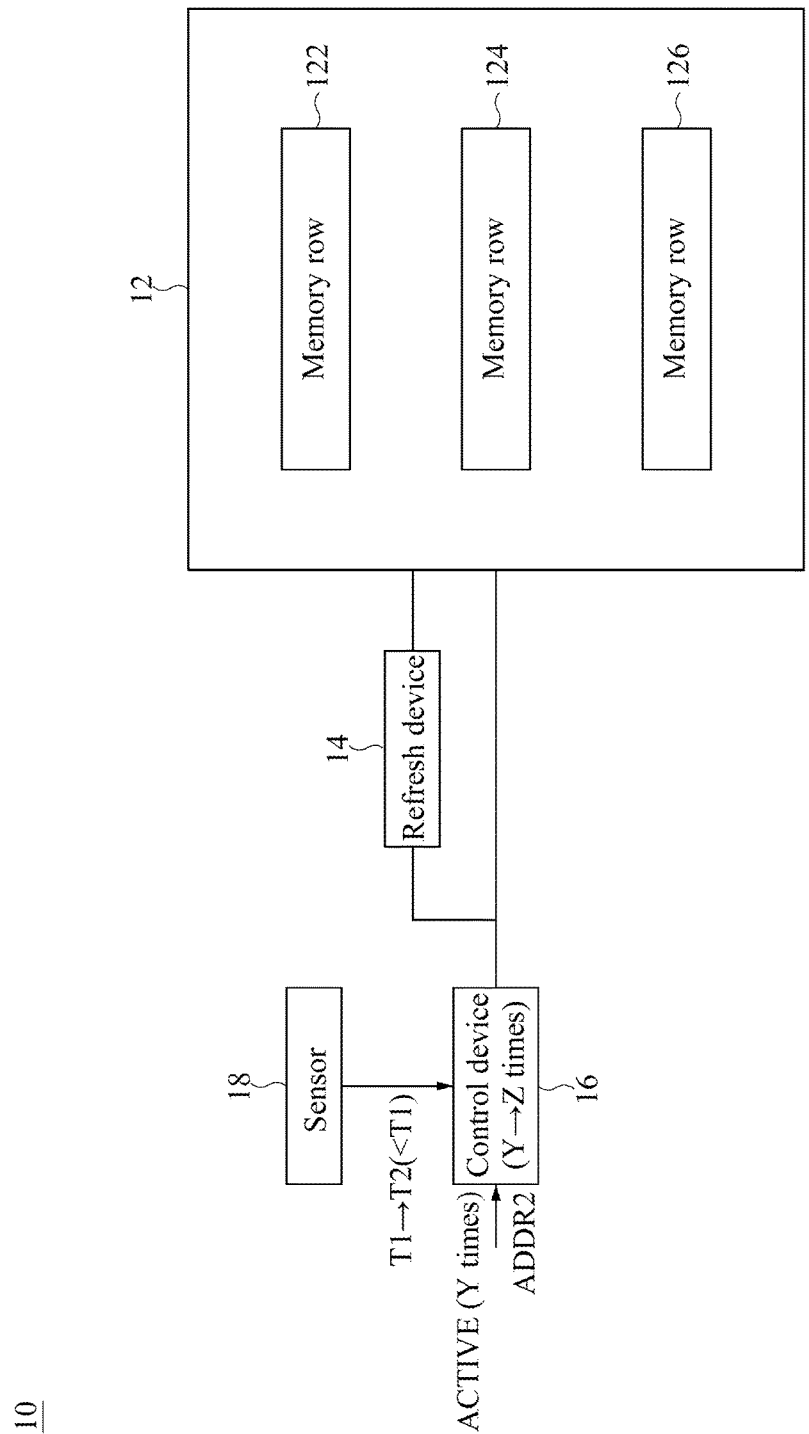
FIG. 8 is a schematic diagram illustrating an operation of the DRAM shown in FIG. 1 in a scenario of adjusting a threshold number of times, in accordance with some embodiments of the present disclosure.

FIG. 8 is a schematic diagram illustrating an operation of the DRAM 10 shown in FIG. 1 in a scenario of adjusting a threshold number of times, in accordance with some embodiments of the present disclosure. Referring to FIG. 8, the control device 16 functions to, according to the temperature, adjust a threshold number of times for determining whether the memory row 124 is eligible for the row-hammer refresh, and selectively allow the memory row 124 to be eligible for the row-hammer refresh according to the threshold number of times.

For example, in a first state, the sensor 18 senses the temperature T1 of the DRAM 10. The control device 16 determines that a threshold number of times is Y times according to the temperature T1.

In a second state following the first state, the sensor 18 senses the temperature T2 (which is less than the temperature T1) of the DRAM 10. The control device 16 increases a threshold number of times from Y times to Z times, which is greater than Y times, according to the temperature T2. Since the access times of Y times is less than the decreased Z times (the threshold number of times), the control device 16, which would otherwise allow the memory row 124 to be eligible in the circumstance that the threshold number of times is Y times, does not allow the memory row 124 to be eligible. In short, the threshold number of times for determining whether the memory row is eligible for a row-hammer refresh positively correlates to the temperature. As a result, power consumption of the DRAM 10 is relatively efficient.

In the embodiment shown in FIG. 8, only an increase in a threshold number of times is described and illustrated. However, the present disclosure is not limited thereto. A decrease in a threshold number of times can be implemented in the similar manner with the increase.

Figure 9:
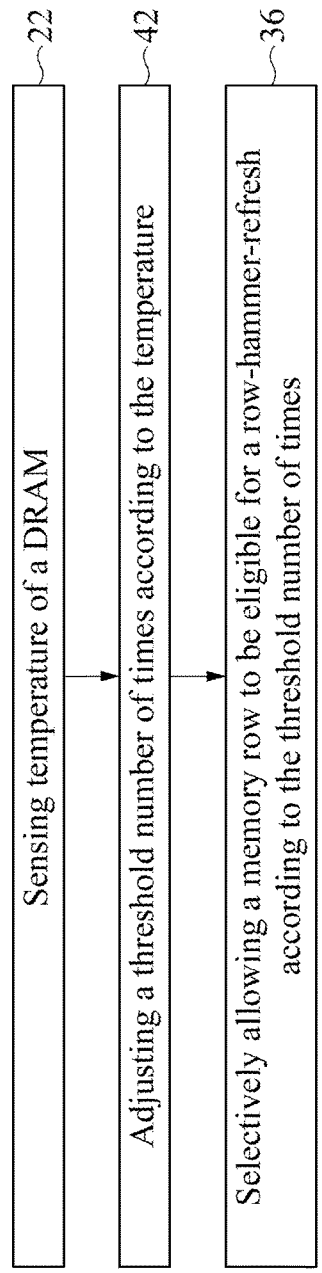
FIG. 9 is a flow chart of still another method of operating a DRAM, in accordance with some embodiments of the present disclosure.

FIG. 9 is a flow chart of still another method 40 of operating a DRAM, in accordance with some embodiments of the present disclosure. Referring to FIG. 9, the method 40 is similar to the method 30 described and illustrated with reference to FIG. 7 except that, for example, the method 40 includes operation 42.

In operation 42, a threshold number of times is adjusted according to the temperature.

The method 40 is merely an example, and is not intended to limit the present disclosure beyond what is explicitly recited in the claims. Additional operations can be provided before, during, and after the method 40, and some operations described can be replaced, eliminated, or moved around for additional embodiments of the method.

In the present disclosure, power consumption of a DRAM adopting the method 40 to perform a row-hammer refresh is relatively efficient.

Figure 10:
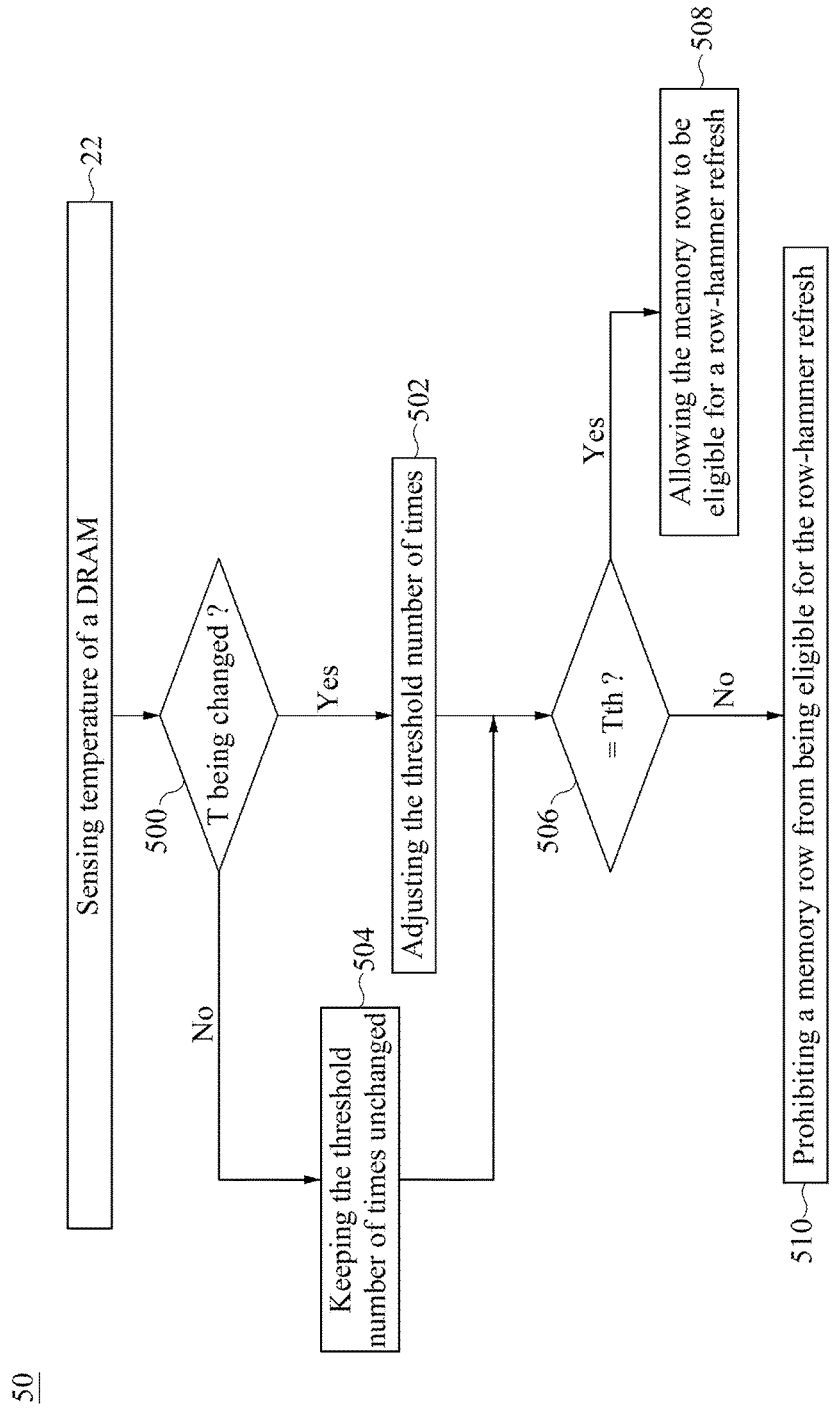
FIG. 10 is a flow chart of yet another method of operating a DRAM, in accordance with some embodiments of the present disclosure.

FIG. 10 is a flow chart of yet another method 50 of operating a DRAM, in accordance with some embodiments of the present disclosure. Referring to FIG. 10, the method 50 is similar to the method 20 described and illustrated with reference to FIG. 2 except that, for example, the method 50 includes operations 500, 502, 504, 506, 508, 510.

Subsequent to operation 22, the method 50 proceeds to operation 500, in which it is determined whether the temperature changes. If affirmative, the method 50 proceeds to operation 502, in which the threshold number of times is adjusted. If negative, the method 50 proceeds to operation 504, in which the threshold number of times is kept unchanged.

Subsequent to operations 502 and 504, the method 50 continues with operation 506, in which it is determined whether an access time of a memory row reaches a threshold number of times. If affirmative, the method 50 proceeds to operation 508, in which the memory row is allowed to be eligible for a row-hammer refresh. If negative, the method 50 continues with operation 510, in which a memory row is prohibited from being eligible for the row-hammer refresh.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method.

In the present disclosure, power consumption of a DRAM adopting the method 50 to perform a row-hammer refresh is relatively efficient.

In the present disclosure, compared to the embodiment shown in FIG. 5, at the relatively high temperature as shown in FIG. 6, the threshold number of times (X times) is relatively low and therefore is easily reached. A row-hammer refresh is performed on the memory row 124 relatively frequently in a given operating environment. As a result, data stored in the memory row 124 is less likely to be lost. In contrast, by comparing the embodiment shown in FIG. 5 to that shown in FIG. 4, in the embodiment of FIG. 4, the temperature T1 is relatively low and therefore the threshold number of times (Y times) is relatively high and therefore is not easily reached. A row-hammer refresh is performed on the memory row 124 relatively infrequently in a given operating environment. As a result, power consumption of the DRAM 10 is relatively efficient.

One aspect of the present disclosure provides a dynamic random access memory (DRAM). The DRAM comprises a storage area and a control device. The storage area includes a memory row. The control device is configured to selectively allow the memory row to be eligible for a row-hammer refresh according to temperature of the DRAM.

Another aspect of the present disclosure provides a dynamic random access memory (DRAM). The DRAM comprises a sensor and a storage area. The sensor is configured to sense a temperature of the DRAM. The storage area includes a memory row. A threshold number of times for determining whether the memory row is eligible for a row-hammer refresh is positively correlated to the temperature.

Another aspect of the present disclosure provides a method of operating a dynamic random access memory (DRAM). The method comprises: sensing temperature of the DRAM; and selectively allowing a memory row to be eligible for a row-hammer refresh according to the temperature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
    a storage area including a memory row; and
    a control device configured to selectively allow the memory row to be eligible for a row-hammer refresh according to a temperature of the DRAM;
    wherein the control device is further configured to determine a threshold number of times for determining whether the memory row is eligible for the row-hammer refresh according to a comparison result between the temperature and a threshold temperature;
    wherein the control device is further configured to selectively allow the memory row to be eligible for the row-hammer refresh according to the threshold number of times;
    wherein when the temperature is higher than the threshold temperature, the control device determines a first threshold times, and wherein when the temperature is lower than the threshold temperature, the control device determines a second threshold times, which is greater than the first threshold times.

2. The DRAM of claim 1, further comprising:
    a sensor configured to sense the temperature of the DRAM.

3. The DRAM of claim 1, wherein the control device is further configured to selectively allow the memory row to be eligible for the row-hammer refresh according to the temperature and access time of the memory row.

4. The DRAM of claim 1, wherein the control device is further configured to, according to the temperature, adjust a threshold number of times for determining whether the memory row is eligible for the row-hammer refresh.

5. The DRAM of claim 4, wherein the control device is further configured to selectively allow the memory row to be eligible for the row-hammer refresh according to the threshold number of times.

6. A dynamic random access memory (DRAM), comprising:
   a sensor configured to sense a temperature of the DRAM;
   a storage area including a memory row; and
   a control device is configured to selectively allow the memory row to be eligible for a row-hammer refresh according to the threshold number of times;
   wherein a threshold number of times for determining whether the memory row is eligible for the row-hammer refresh positively correlates to the temperature;
   wherein the control device is further configured to determine the threshold number of times according to a comparison result between the temperature and a threshold temperature;
   wherein when the temperature is higher than the threshold temperature, the control device determines a first threshold times, and when the temperature is lower than the threshold temperature, the control device determines a second threshold times, which is greater than the first threshold times.

7. The DRAM of claim 6, wherein the control device is further configured to selectively allow the memory row to be eligible for the row-hammer refresh according to the temperature of the DRAM and access time of the memory row.

8. The DRAM of claim 6, wherein the control device is further configured to, according to the temperature, adjust the threshold number of times.

9. A method of operating a dynamic random access memory (DRAM), comprising:
   sensing a temperature of the DRAM; and
   selectively allowing a memory row to be eligible for a row-hammer refresh according to the temperature;
   determining a threshold number of times for determining whether the memory row is eligible for the row-hammer refresh according to a comparison result between the temperature and a threshold temperature; and
   selectively allowing the memory row to be eligible for the row-hammer refresh according to the threshold number of times;
   wherein when the temperature is higher than the threshold temperature, the control device determines a first threshold times, and when the temperature is lower than the threshold temperature, the control device determines a second threshold times, which is greater than the first threshold times.

10. The method of claim 9, further comprising:
selectively allowing the memory row to be eligible for the row-hammer refresh according to the temperature and access time of the memory row.

11. The method of claim 9, further comprising:
adjusting a threshold number of times for determining whether the memory row is eligible for the row-hammer refresh according to the temperature.

12. The method of claim 11, further comprising:
selectively allowing the memory row to be eligible for the row-hammer refresh according to the threshold number of times.

* * * * *